United States Patent [19]

Jokerst et al.

[11] Patent Number: 5,401,983
[45] Date of Patent: * Mar. 28, 1995

[54] PROCESSES FOR LIFT-OFF OF THIN FILM MATERIALS OR DEVICES FOR FABRICATING THREE DIMENSIONAL INTEGRATED CIRCUITS, OPTICAL DETECTORS, AND MICROMECHANICAL DEVICES

[75] Inventors: Nan M. Jokerst; Martin A. Brooke; Mark G. Allen, all of Atlanta, Ga.

[73] Assignee: Georgia Tech Research Corporation, Atlanta, Ga.

[ * ] Notice: The portion of the term of this patent subsequent to Jan. 18, 2011 has been disclaimed.

[21] Appl. No.: 44,251

[22] Filed: Apr. 7, 1993

Related U.S. Application Data

[63] Continuation-in-part of Ser. No. 865,379, Apr. 8, 1992, Pat. No. 5,280,184, and Ser. No. 865,126, Apr. 8, 1992, Pat. No. 5,244,818.

[51] Int. Cl.$^6$ ............................................. H01L 31/12
[52] U.S. Cl. ........................................ 257/82; 257/84; 257/85; 257/98; 257/443; 372/50; 437/915; 437/944
[58] Field of Search ...................... 257/82, 85, 98, 443, 257/84; 372/50; 437/915, 944

[56] References Cited

U.S. PATENT DOCUMENTS

| | | | |
|---|---|---|---|
| 3,959,045 | 5/1976 | Antypas | 156/3 |
| 3,971,860 | 7/1976 | Broers et al. | 427/43 |
| 4,016,644 | 4/1977 | Kurtz | 29/583 |
| 4,058,821 | 11/1977 | Miyoshi et al. | 357/19 |
| 4,152,713 | 5/1979 | Copeland, III et al. | 257/85 |
| 4,160,308 | 7/1979 | Courtney et al. | 29/588 |
| 4,321,613 | 3/1982 | Hughes et al. | 357/22 |
| 4,426,768 | 1/1984 | Black et al. | 29/583 |
| 4,584,039 | 4/1986 | Shea | 156/150 |
| 4,596,070 | 6/1986 | Bayraktaroglu | 29/571 |
| 4,604,160 | 8/1986 | Murakami et al. | 156/630 |
| 4,667,212 | 5/1987 | Nakamura | 257/85 |
| 4,670,765 | 6/1987 | Nakamura et al. | 257/444 |
| 4,672,577 | 6/1987 | Hirose et al. | 257/443 X |
| 4,737,833 | 4/1988 | Tabei | 257/444 X |
| 4,755,474 | 7/1988 | Moyer | 437/3 |
| 4,766,471 | 8/1988 | Ovshinsky et al. | 357/19 |

(List continued on next page.)

FOREIGN PATENT DOCUMENTS

| | | | |
|---|---|---|---|
| 52-70752 | 6/1977 | Japan . | |
| 57-106181 | 7/1982 | Japan | 257/84 |
| 59-29477 | 2/1984 | Japan | 257/80 |
| 62-285432 | 12/1987 | Japan | 437/183 |
| 63-276228 | 11/1988 | Japan | 148/135 |
| 2152749 | 8/1985 | United Kingdom | 257/80 |

OTHER PUBLICATIONS

Yablonovitch, E., et al., "Double Heterostructure GaAs/AlGaAs Thin Film Diode Lasers on Glass Sub-Strates," *IEEE Photo. Tech. Lett.,* vol. 1, No. 2, Feb. 1989, pp. 41–42.

Little, J., et al., "The 3-D Computer," *International Conference on Wafer Scale Integration Proceedings,* pp. 55–92, 1989, IEEE.

Manabe, S., et al., "A 2-Million-Pixel CCD Image Sensor Overlaid with an Amorphous Silicon Photocon-
(List continued on next page.)

*Primary Examiner*—William Mintel
*Attorney, Agent, or Firm*—Hopkins & Thomas

[57] ABSTRACT

Various novel lift-off and bonding processes (60, 80, 100) permit lift-off of thin film materials and devices (68), comprising In$_x$Ga$_{1-x}$As$_y$P$_{1-y}$ where $0<x<1$, and $0<y<1$, from a growth substate (62) and then subsequent alignable bonding of the same to a host substrate (84). As a result, high quality communication devices can be fabricated for implementing a three dimensional electromagnetic communication network within a three dimensional integrated circuit cube (10), an array (90) of optical detectors (98) for processing images at very high speed, and a micromechanical device (110) having a platform (114) for steering or sensing electromagnetic radiation or light.

35 Claims, 8 Drawing Sheets

U.S. PATENT DOCUMENTS

| | | | |
|---|---|---|---|
| 4,782,028 | 11/1988 | Farrier et al. | 437/3 |
| 4,846,931 | 7/1989 | Gmitter et al. | 156/633 |
| 4,871,224 | 10/1989 | Karstensen et al. | 350/96.15 |
| 4,897,360 | 1/1990 | Guckel et al. | 437/7 |
| 4,899,204 | 2/1990 | Rosen et al. | 257/82 X |
| 4,975,390 | 12/1990 | Fujii et al. | 437/228 |
| 5,023,944 | 6/1991 | Bradley | 455/611 |
| 5,093,879 | 3/1992 | Bregman et al. | 257/80 X |
| 5,102,821 | 4/1992 | Moslehi | 437/62 |
| 5,171,712 | 12/1992 | Wang et al. | 437/183 |
| 5,280,184 | 4/1992 | Jokerst et al. | 257/82 |

OTHER PUBLICATIONS version Layer," *IEEE Transcript on Electronic Devices*, vol. 38, No. 8, pp. 1765–1771, Aug. 1991.

Kostuk, R. K., et al., "Optical Imaging Applied to Microelectronic Chip-To-Chip Interconnections," *Appl. Opt.*, vol. 24, No. 17, Sep. 1985, pp. 2851–2858.

Goodwin, M. J. et al., "Hybridised Optoelectronic Modulator Arrays for Chip-To-Chip Optical Inter--Connection," *SPIE Proc.*, vol. 1281, pp. 207–212, 1990.

Yariv, A., "The Beginning of Integrated Opto-Electronic Circuits," *IEEE Trans. Electron Devices*, vol. ED-31, No. 11, Nov. 1984, pp. 1656–1661.

Ayliffe, P. J., et al., "Comparison of Optical and Electrical Interconnections at the Board and Backplane Levels," *SPIE Proc.*, vol. 1281, 1990, pp. 2–15.

Turner, G. W., et al., "Through-Wafer Optical Communication Using Monolithic InGaAs-on-Si LED's and Monolithic PtSi-Si Schottky-Barrier Detectors," *IEEE Photonics Technology Letters*, vol. 3, No. 8, Aug. 1991, pp. 761–763.

Yablonovitch, E., et al., "Extreme selectivity in the lift-off of epitaxial GaAs films," *Appl. Phys. Lett.*, pp. 2222–2224, 1987.

Pollentier, I., "Fabrication of a GaAs-AlGaAs GRIN-SCH SQW Laser Diode on Silicon by Epitaxial Lift-Off," *IEEE Photonics Technology Letters*, vol. 3, No. 2, pp. 115–117, Feb. 1991.

Allen, M. G., et al., "Microfabricated Structures for the In-Situ Measurement of Residual Stress, Young's Modulus, and Ultimate Strain of Thin Films," *Applied Physics Letters*, vol. 51, No. 4, pp. 241–244, Jul. 1987.

PROCESSES FOR LIFT-OFF OF THIN FILM MATERIALS OR DEVICES FOR FABRICATING THREE DIMENSIONAL INTEGRATED CIRCUITS, OPTICAL DETECTORS, AND MICROMECHANICAL DEVICES

The U.S. Government has a paid-up license in this invention and the right in limited circumstances to require the patent owner to license others on reasonable terms as provided by the terms of Contract Number ECS90-58-144 awarded by the National Science Foundation.

This document is a continuation-in-part of U.S. application Ser. No. 07/865,379, filed Apr. 8, 1992, by the same inventors herein for THREE DIMENSIONAL INTEGRATED CIRCUITS, now U.S. Pat. No. 5,280,184, and of U.S. application Ser. No. 07/865,126, filed Apr. 8, 1992, by the same inventors herein for PROCESSES FOR LIFT-OFF OF THIN FILM MATERIALS AND FOR THE FABRICATION OF THREE DIMENSIONAL INTEGRATED CIRCUITS, now U.S. Pat. No. 5,244,818.

FIELD OF THE INVENTION

The present invention generally relates to integrated circuit technology, and more particularly, to novel processes for the lift-off of any thin film material or device from a growth substrate and alignable bonding of the same to a host substrate as well as to the implementation of three dimensional integrated circuit cubes, resonant cavity devices, optical detectors, and micromechanical devices using the foregoing novel processes.

BACKGROUND OF THE INVENTION

The monolithic integration of gallium arsenide (GaAs) materials and devices with host substrates, such as silicon (Si), glass ($SiO_2$), and polymers, will enable the fabrication of the next generation of integrated circuits, optical devices, and micromechanical devices, because it is known that $In_xGa_{1-x}As_yP_{1-y}$ materials, where $0<x<1$ and $0<y<1$, and devices comprising the foregoing materials are ideal for electromagnetic communications applications.

A standard technique for GaAs on Si integration is heteroepitaxial growth, which is described in H. Choi J. Mattia, G. Turner, and B. Y. Tsauer, "Monolithic Integration of GaAs/AlGaAs LED and Si Driver Circuit", *IEEE Electron Dev. Lett.*, vol.9, pp. 512–514, 1988. However, the crystal quality of this heteroepitaxial material is often inadequate for many optical applications.

An integration method which seeks to preserve the high material quality of lattice-matched growth is the epitaxial lift-off process developed by Bell Communications Research, Inc., (Bellcore), as described in E. Yablonovitch, T. J. Gmitter, J. P. Harbison, and R. Bhat, "Double Heterostructure GaAs/AlGaAs Thin Film Diode Lasers on Glass Substrates", *IEEE Phot. Tech. Lett.*, 1, pp. 41–42, 1989. Essentially, a thin aluminum arsenide (AlAs) sacrificial layer is deposited, or grown, on a GaAs substrate, and then GaAs/AlGaAs device epitaxial layers are grown on top of the AlAs layer. The GaAs/AlGaAs lattice-matched epitaxial layers are separated from the growth substrate by selectively etching the AlAs sacrificial layer. These device layers are then mounted in a hybrid fashion onto a variety of host substrates. The device layers are of high quality and are currently being used for the integration of GaAs/AlGaAs materials with host substrates, such as Si, glass, lithium niobate, and polymers.

However, although the Bellcore technique yields high quality material, it has several problems, including the inability to align and selectively bond the devices. Moreover, there are difficulties in contacting and depositing material layers on both sides of the devices. Hence, at present, the Bellcore technique is inadequate for producing emitters, detectors, and modulators for three dimensional integrated circuits.

SUMMARY OF TEE INVENTION

The present invention provides various novel processes for monolithically integrating any thin film material or any device, including semiconductors and compound semiconductors. The processes involve separation, or "lift-off, " of the thin film material or device from a growth substrate, selective alignment of the same, and then selective bonding of the same to a host substrate. Significantly, the novel processes may be utilized to produce and bond high quality emitters, detectors, or modulators for implementing three dimensional communication, and consequently, the fabrication of three dimensional integrated circuit cubes is realized. Other various optical applications are also contemplated as described herein. Moreover, the processes may be utilized in the fabrication of micromechanical devices.

In accordance with the present invention, a first lift-off and bonding process (reference numeral 60; FIGS. 3A–3G) comprises the following steps. A thin film material is deposited on a sacrificial layer situated on a growth substrate. Optionally, a device may be defined or patterned in the thin film material. All exposed sides of the material or device, if applicable, are coated with a transparent carrier layer. The sacrificial layer is then etched away to release from the growth substrate the combination of the transparent carrier layer and either the material or the device. The material or device can then be selectively aligned and bonded to a host substrate. If the carrier layer comprises a plurality of devices, then they can be selectively bonded to the host substrate. Finally, the transparent carrier layer is removed, thereby leaving the material or device on the host substrate.

In accordance with the present invention, a second lift-off and bonding process (reference numeral 80; FIGS. 4A–4H) comprises the following steps. A thin film material is deposited on a sacrificial layer situated on a growth substrate. Optionally, a device may be defined, or patterned, in the thin film material. All exposed sides, or the exposed region, of the material or device, if applicable, are coated with a carrier layer. The sacrificial layer is etched away to release the combination of the material or device and the carrier layer from the growth substrate. The material or device is then bonded to a transfer medium. The carrier layer is removed. Finally, the material or device is aligned and selectively bonded to a host substrate from the transfer medium.

In accordance with the present invention, a third lift-off and bonding process (reference numeral 100; FIGS. 7A–7G) comprises the following steps. A thin film material is deposited on a sacrificial layer which is deposited on a growth substrate. Optionally, a device may be defined, or patterned, in the thin film material.

All exposed sides, or the exposed region, of the material or device, if applicable, are coated with a carrier layer. The growth substrate is etched away. The sacrificial layer may be retained or is etched away. The device is bonded to a transfer medium. The carrier layer is removed. Finally, the material or device is aligned and bonded to the host substrate from the transfer medium.

Figure 1:
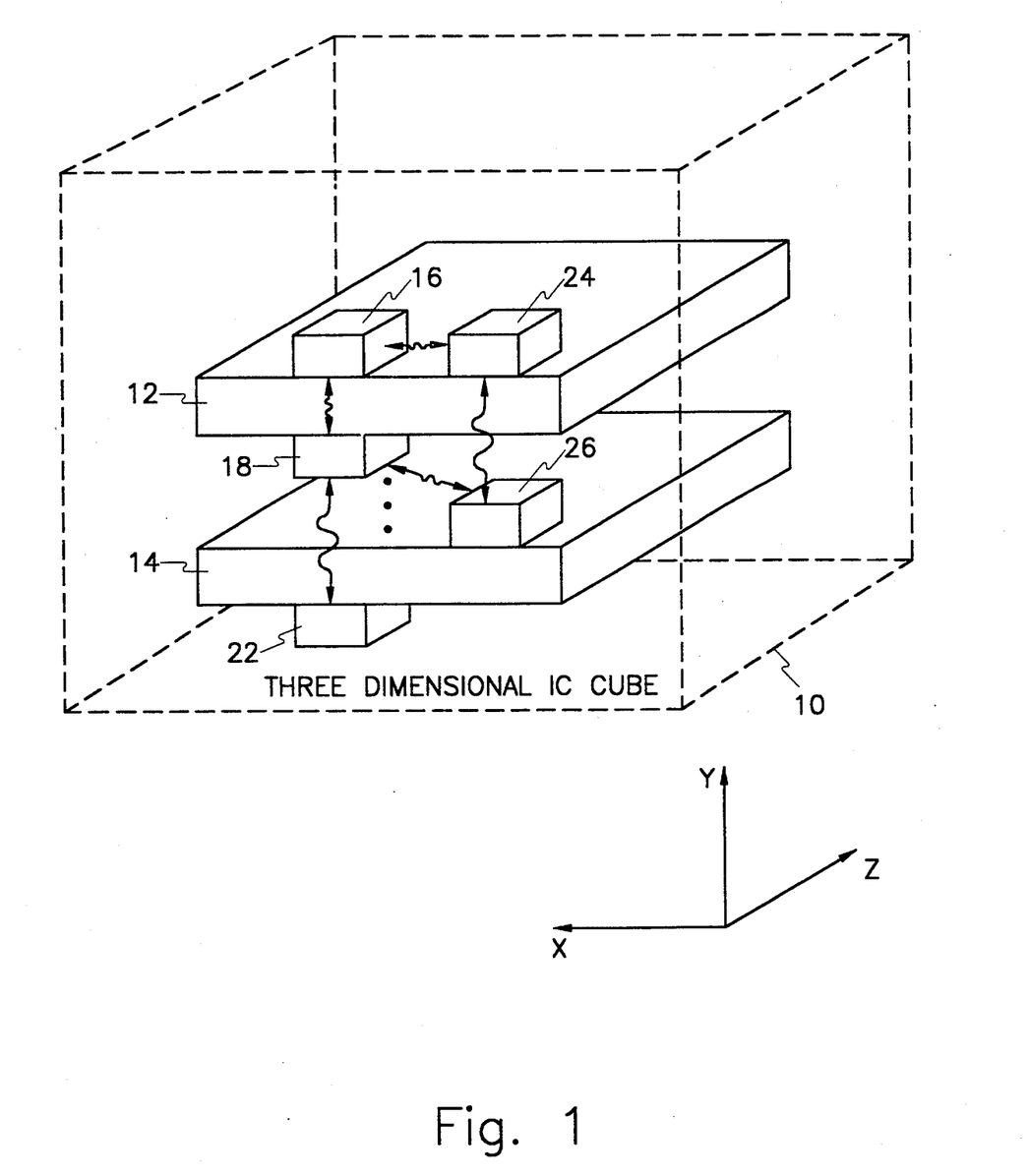
FIG. 1 shows a three dimensional integrated circuit cube having three dimensional electromagnetic communication capabilities throughout.

The present invention provides for three dimensional integrated circuit cubes (reference numeral 10; FIG. 1) and other applications via the aforementioned novel lift-off and bonding processes. These processes are used for monolithically integrating thin film electromagnetic emitters, detectors, or modulators. In a monolithic three dimensional integrated circuit cube fabricated in accordance with the present invention, electromagnetic communication occurs vertically through any integrated circuit layer(s), which can have operational circuitry, and/or occurs laterally in the same integrated circuit layer. Electromagnetic signals are sent from an emitter and received by one or more detectors situated at some other location anywhere in the integrated circuit cube.

In basic concept, the three dimensional integrated circuit cube can be described as follows. A first integrated circuit layer in the three dimensional integrated circuit has a first and a second side. An emitter situated either on the first side or on a layer spaced from the first integrated circuit layer sends electromagnetic signals towards the direction of the first side. The emitter can have an emitting junction, for example, created by $In_xGa_{1-x}As_yP_{1-y}$ materials (n-type coupled to p-type), where $0<x<1$ and $0<y<1$. The signals sent from the emitter pass through one or more layers because the layers are transparent to the carrier frequency of the signals. A detector is situated to receive the electromagnetic signals from the direction of the second side. The detector can be situated on the second side of the integrated circuit layer or on a different layer in the integrated circuit. Moreover, the detector can have a detecting junction, for example, that may be created by the materials used in the emitter. Worth noting is that the emitter and detector may be identical except for electrical excitation, and may be freely interchanged by changing electrical excitation so as to further increase the flexibility of the proposed invention. Finally, the foregoing emitters and detectors can be situated anywhere throughout the integrated circuit so as to provide for a very complex and flexible three dimensional communication network.

The present invention provides for the fabrication of a high performance resonant cavity device (reference numeral 50; FIG. 2C), which can be operated as an emitter, detector, or modulator. The resonant cavity device comprises an active region having a first side and a second side. The active region may have a diode configuration or some other element which emits, detects, or modulates electromagnetic energy. A first mirror layer is situated adjacent to the first side of the device and is deposited after the active region is deposited on a first substrate. A second mirror layer is situated adjacent to the second side and is deposited after the active region with the first mirror layer are bonded to a second substrate.

Figure 5:
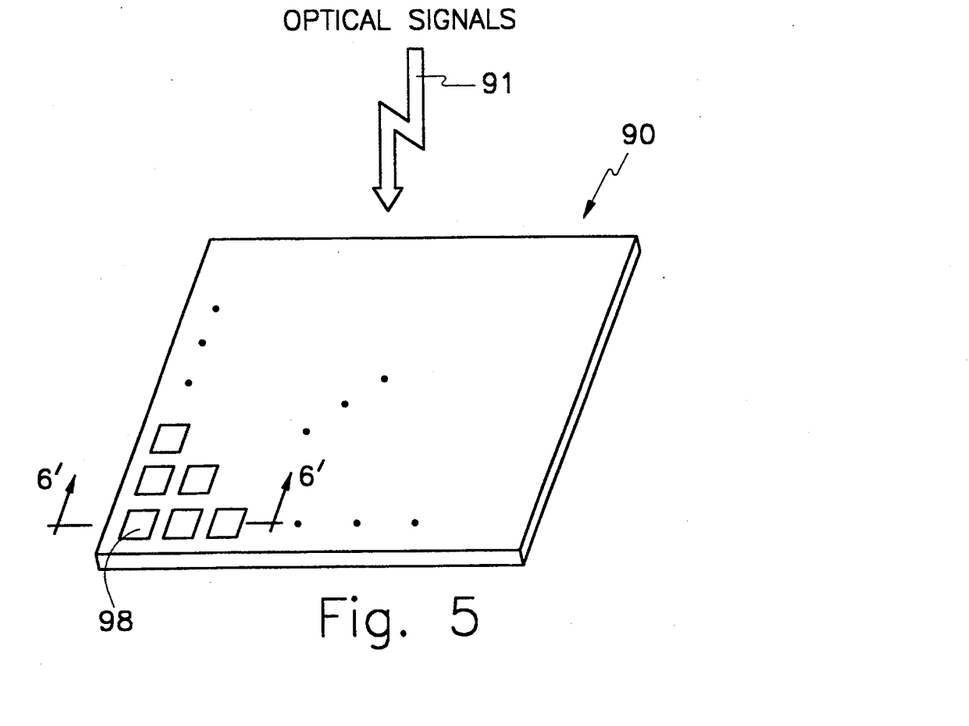
FIG. 5 shows an array of optical detectors.
Figure 6:
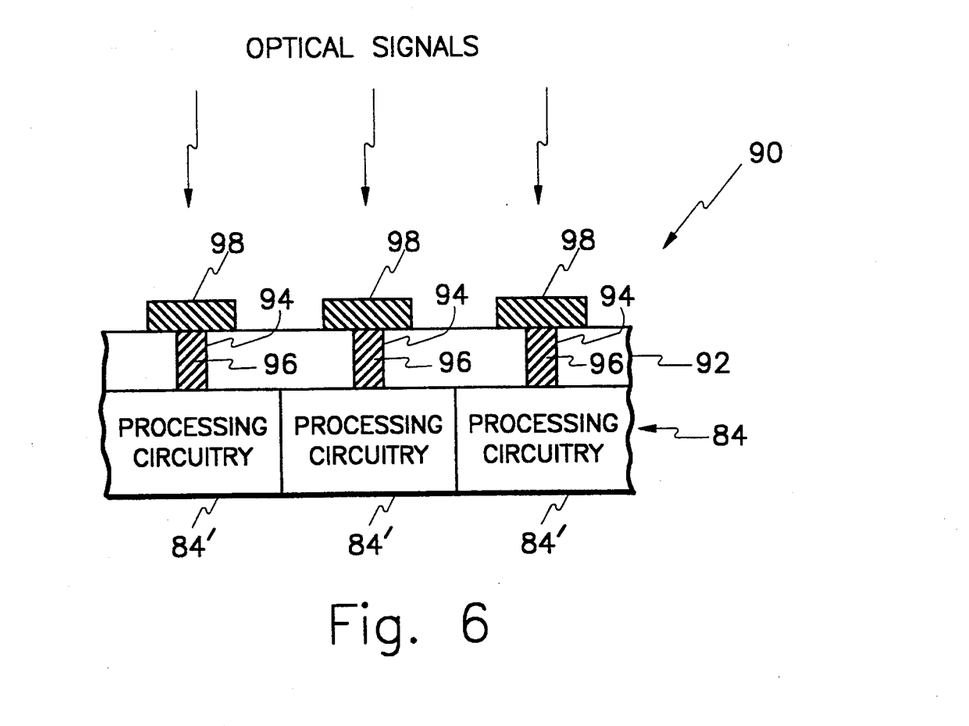
FIG. 6 shows a partial cross section of the array of optical detectors of FIG. 5 taken along line 6'—6'.

The present invention provides for the fabrication of an array of optical detectors (reference numeral 90; FIGS. 5, 6) for an imaging or video system. The array of optical detectors is monolithically formed on an external surface of an integrated circuit. Each integrated layer has a polyimide or other electrically insulating layer with a top and a bottom and a hole therethrough leading to processing circuitry. The thin film detectors, placed on top of the polyimide or other electrically insulating layer, convert the optical signal to an electrical signal. The processing circuitry is configured to process the converted optical signals. The hole is filled with a conductor configured to transport the converted optical signals to the processing circuitry. The detectors can be made of an epitaxial layer, for example, comprised of either GaAs, InP or InGaAsP situated at the top of the polyimide layer in contact with the metal. The epitaxial layer alone can create a detecting junction, or the epitaxial layer in combination with the metal can create a detecting junction which receives optical signals from an exterior source and immediately transmits the signals to the processing circuitry.

Figure 8:
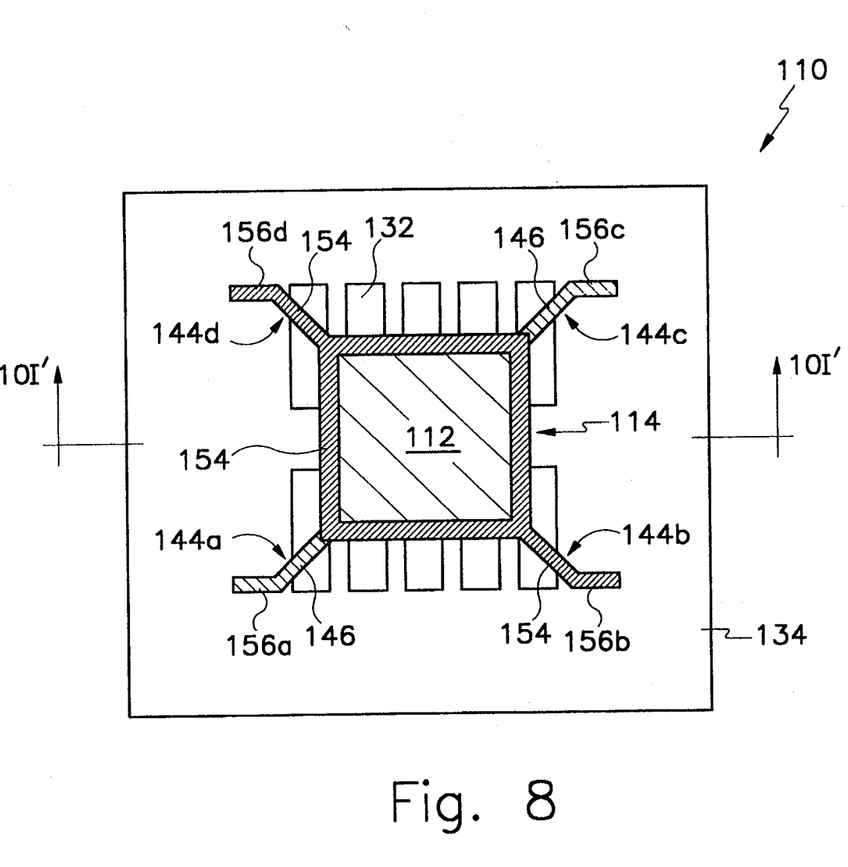
FIG. 8 shows a micromechanical device.

The present invention provides for the fabrication of a micromechanical device (reference numeral 110; FIG. 8, 10I) for providing efficient steerable optical coupling with integrated circuitry. The micromechanical device comprises a movable platform supported by legs on a substrate. The substrate has one or more substrate electrodes and the platform has a bottom electrode. The platform is moved by applying a first electrical source between the first and bottom electrodes. Moreover, a photonic device resides on the platform and is movable with the platform. The photonic device has a top electrode thereon. Further, the photonic device serves as a light interface, by emitting, receiving, or modulating light, when a second electrical source is applied between the top and the bottom electrodes.

FEATURES AND ADVANTAGES

The present invention overcomes the deficiencies of the prior art, as noted above, and further provides for the following features and advantages.

An advantage of the novel processes of the present invention is that they provide for the lift-off of any thin film material or device from a growth substrate, alignment of the same, and then selective bonding of the same to a host substrate. The thin film material and the host substrate can comprise any materials, including amorphous, polycrystalline, crystalline materials, or combinations thereof.

Another advantage of the novel processes of the present invention is that they provide a means for handling and bonding discrete devices which are too thin and delicate for manipulation by conventional means.

Another advantage of the novel processes of the present invention is that they provide for the lift-off and bonding of $In_xGa_{1-x}As_yP_{1-y}$ materials and devices (n-type or p-type), where $0<x<1$ and $0<y<1$, which are ideal for communications and optical applications.

Another advantage of the novel processes of the present invention is that they provide for selective alignment and selective bonding of particular devices from arrays of devices to existing circuitry. Moreover, contacts may be provided on both sides of the device.

Another advantage of the novel processes of the present invention is that material layers, such as metals, semiconductors, or dielectrics, can be easily applied to both sides of a thin film material or device, thereby potentially decreasing cost and improving performance. An example is a low cost, high performance, resonant cavity emitter, detector, or modulator.

Another advantage of the novel processes of the present invention is that they can be used to easily, inexpensively, and efficiently fabricate three dimensional communication networks within integrated circuits. As a result, massively parallel processing is possible, thereby enhancing processing speed.

Another advantage of the processes of the present invention is that they provide for extensive image processing and video applications. Optical detectors fabricated from semiconductor materials, such as GaAs, InP, or InGaAsP based materials, can be integrated directly on top of an existing Si, GaAs, or Si substrate. Further, the Si substrate could have processing circuitry for processing signals received by individual optical detectors or aggregates thereof.

Another advantage of the processes of the present invention is that they can be utilized to fabricate micromechanical devices. Thin film materials or devices can be bonded to a very small movable element of the micromechanical device.

Another advantage of the three dimensional integrated circuit cube of the present invention is that it provides for massively parallel input/output (I/O) ports. Specifically, the number of I/O lines which can interface to an integrated circuit is substantially enhanced, because I/O contacts can be placed not only around the sides of the integrated circuit cube, but also on the top and bottom. These I/O can be very fast, and optical I/O as well. In essence, integrated circuit "cubes" are constructed.

Another advantage of the three dimensional integrated circuit cube of the present invention is that electronic circuits can be produced to occupy less space due to an enhanced three dimensional interconnection network.

Another advantage of the three dimensional integrated circuit cube of the present invention is that they can be fabricated from inexpensive Si and/or GaAs wafers. In other words, integrated circuits can be first fabricated in an inexpensive manner using conventional Si or GaAs foundries. Then, optical emitters and/or detectors can be attached to the foundry Si or GaAs circuits in post-processing steps.

Another advantage of the three dimensional integrated circuit cube of the present invention is that the Si or GaAs circuitry and the emitters/detectors can be independently optimized and/or tested before integration for high yield and high performance.

Further features and advantages of the present invention will become apparent to one skilled in the art upon examination of the following drawings and the detailed description. It is intended that any additional features and advantages be incorporated herein.

BRIEF DESCRIPTION OF THE DRAWINGS

The present invention, as defined in the claims, can be better understood with reference to the following drawings. The drawings are not necessarily to scale, emphasis instead being placed upon clearly illustrating principles of the present invention.

FIGS. 10A-10I Show a fabrication process for producing the micromechanical device of FIG. 8, and specifically.

DETAILED DESCRIPTION OF THE PREFERRED EMBODIMENTS

I. Three Dimensional Integrated Circuits

FIG. 1 illustrates a multilayered integrated circuit cube (IC), 10 wherein electromagnetic communication can occur in all directions throughout the three dimensional structure. Significantly, in addition to planar communication, vertical communication can occur directly through one or more integrated circuit layers 12, 14, thereby resulting in a truly three dimensional communication network. Although not shown for simplicity, the integrated circuit cube 10 can have numerous layers, and the principles described herein are equally applicable.

In the present invention, integrated circuit layers communicate via electromagnetic signals which can pass unhindered through the layers due to the wavelength associated with the electromagnetic signals. If layers 12, 14 are fabricated from Si, then the electromagnetic signals must have a wavelength $\lambda$ greater than 1.12 micrometers ($\mu$m) in order for the Si to be transparent to the electromagnetic signals. If the layers 12, 14 are GaAs, then the wavelength $\lambda$ must be greater than 0.85 $\mu$m to establish transparency of the electromagnetic signals. However, many communications wavelengths are possible depending upon the chemical composition of the layers 12, 14. Furthermore, with the implementation of modulation techniques, the number of potential communication channels is virtually infinite.

As shown in FIG. 1, electromagnetic communication devices 16-22 are positioned throughout the integrated circuit cube 10 to permit communication throughout the cube 10, and importantly, to permit vertical communication through IC layers 12, 14. Each of the communication devices 16-22 can be operated as an emitter, detector, or modulator, and these devices 16-22 communicate signals amongst each other as indicated by propagation arrows in FIG. 1. Moreover, the electromagnetic communication devices 16-22 can also be switched so as to operate as more than one of the foregoing communication elements. In other words, for example, any of the electromagnetic communication devices 16-22 could be switched to operate as both an emitter and a detector, or as a transceiver.

Figure 2A:
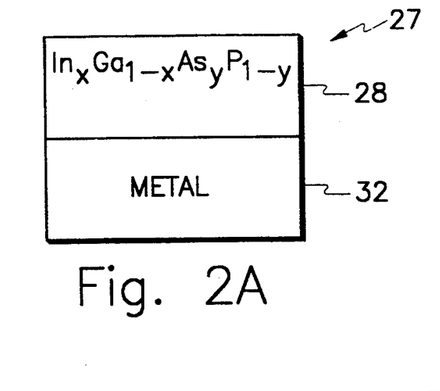
FIGS. 2A-2C show examples of various electromagnetic communication devices which are usable as emitters, detectors, or modulators within the three dimensional integrated circuit cube of FIG. 1 or in other various applications.
Figure 2B:
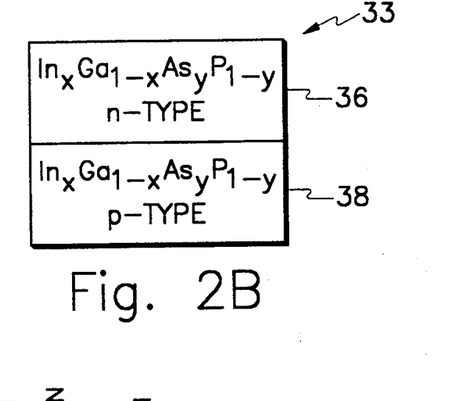
Figure 2C:
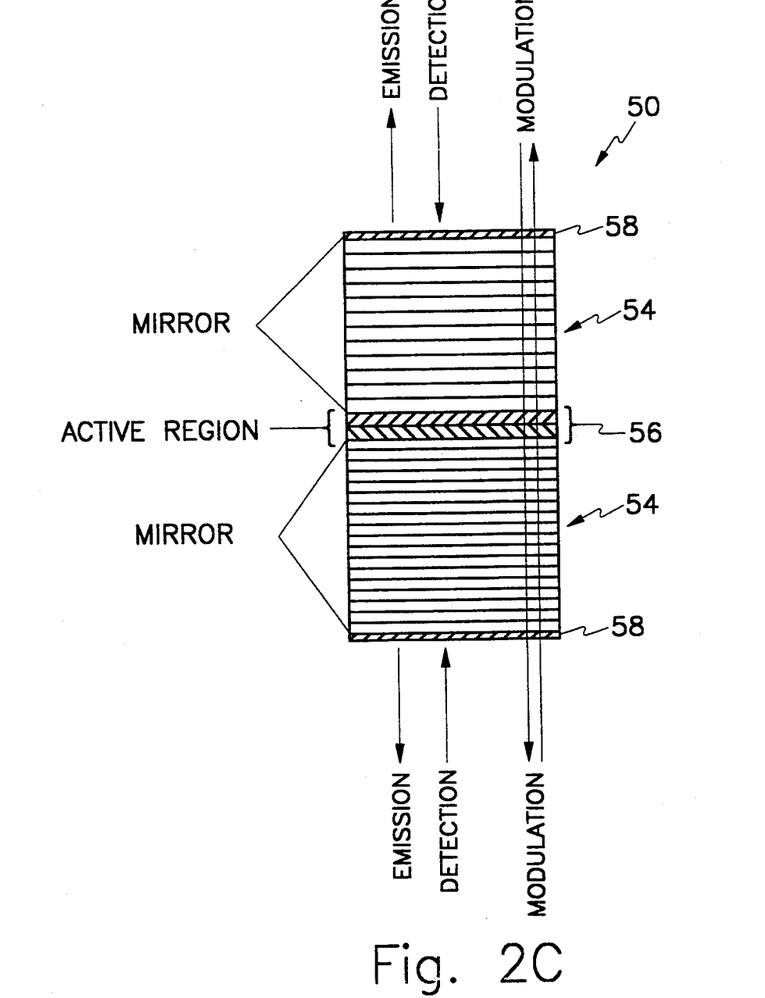

FIGS. 2A through 2C show various specific examples of electromagnetic communication devices which can be used to implement the electromagnetic communication channels of FIG. 1. FIGS. 2A through 2C illustrate devices having diode configurations. Each diode configuration can act as an emitter, detector, and/or modulator, which concept is well known in the art. Essentially, electromagnetic signals (including optical signals) are created, detected, or modulated by the diode configurations based upon the electrical biasing applied to the junction formed by the two materials adjoined in each of the diode configurations. For a discussion of diode configurations used for electromagnetic communications purposes, see S. M. Sze, *Physics of Semiconductor Devices*(1981). It should be noted that the devices of FIGS. 2A-2C must be of very high quality in order to communicate at the wavelengths mentioned previously relative to Si ($\lambda > 1.12 \mu m$) and GaAs ($\lambda > 0.85$).

The electromagnetic communication devices of FIGS. 2A-2C are described hereafter. FIG. 2A shows a metal-semiconductor-metal (MSM) diode 33. In the MSM diode 33, $In_xGa_{1-x}As_yP_{1-y}$ materials 28 (n-type or p-type), where $0 < x < 1$ and $0 < y < 1$, are coupled to a metal 32, such as gold, silver, copper, aluminum, or the like.

FIGS. 2B shows another semiconductor diode 33. An n-type $In_xGa_{1-x}As_yP_{1-y}$ material 36, where $0 < x < 1$ and $0 < y < 1$, is coupled to a p-type $In_xGa_{1-x}As_yP_{1-y}$, material 38, where $0 < x' < 1$ and $0 < y' < 1$.

FIG. 2C shows a resonant cavity device 50 having an active region 56, mirrors 54 adjacent to the active region 56, and optional contact layers 58 adjacent to the mirrors 54. The active region 56 can be a diode configuration, for example, one of those diode configurations shown in FIGS. 2A or 2B, or some other suitable element which emits, detects, or modulates electromagnetic energy. Mirrors 54 may comprise any metal, semiconductor, or dielectric layer, or combinations thereof, but preferably is a plurality of $In_xGa_{1-x}As_yP_{1-y}$ semiconductor layers where $0 < x < 1$ and $0 < y < 1$, for providing essentially signal frequency filtering, which concept and implementation is well known in the art. In other words, the vertical span of the mirrors 54, or the distance between each metal layer 58 and the active region 56 determines the wavelength of signal which is received with the highest signal intensity. Finally, the contact layers 58 may comprise a metal, semiconductor, or dielectric layer, or combinations thereof, but preferably is a metal layer, for biasing the device 50 so that it responds as an emitter, detector, or modulator. However, it should be noted that the device 50 may be biased by some other means, such as with an optic beam, in which case, the contacts 58 are not required for operation of the device 50.

Communication using the diode configurations is initiated as follows. The diode configuration is first biased with a voltage. Propagation or reception depends, in large part, upon the device design and direction of voltage biasing. The diode configurations of FIG. 2A through 2C will send and receive electromagnetic signals having wavelengths $\lambda$ between 1.3 and 1.55 microns, which is well above the Si and GaAs transparency wavelength thresholds of 1.12 and 0.85 microns, respectively. Note that communication is possible using different emitter and detector types, depending upon the materials utilized in the configuration.

It is further envisioned that modulators, for instance, multiple quantum well (MQW) reflective electroabsorption light modulators, that emitters, for instance, surface emitting lasers (SELs) and vertical cavity surface emitting lasers (VCSELs), and that detectors, for instance, resonant cavity detectors which are developed from $In_xGa_{1-x}As_yP_{1-y}$ compounds, where $0 < x < 1$ and $0 < y < 1$, can be employed to more efficiently communicate the signals in the three dimensional integrated circuit cube 10 of FIG. 1. These devices cause less heating problems and can switch much faster than diode configurations. Detailed discussions regarding SELs and VCSELs can be found in *IEEE Journ. Quant. Elect.*, Vol. 64, No. 6, Special Issue on Semiconductor Lasers, 1991, and J. Jewell, J. Harbison, A. Scherer, Y. Lee and L. Florez, *IEEE Journal Quant. Elect.*, Volume 7, No. 6, pp. 1332-1346.

The bonding of high quality $In_xGa_{1-x}As_yP_{1-y}$ based materials and devices to host substrates is a key element to the realization of the diode configurations of FIGS. 2A-2C and the envisioned laser configurations, and more generally, to the realization of three dimensional IC cubes and other applications in accordance with the present invention. To provide for the bonding of $In_xGa_{1-x}As_yP_{1-y}$ based materials, the inventors have developed several advanced lift-off and bonding processes 60, 80, 100 discussed in detail hereafter. These processes 60, 80, 100 generally provide for lifting-off and subsequent bonding of thin film materials or devices, such as compound semiconductors, having a thickness of typically less than 20 micrometers.

II. First Lift-Off And Bonding Process

Figure 3A:
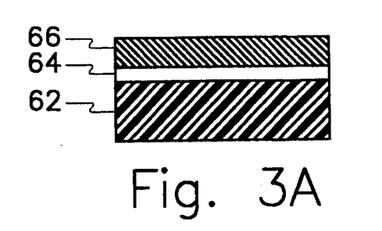
FIG. 3A-3G show a first lift-off and bonding process for thin film materials or devices, such as the devices of FIGS. 2A-2C, wherein a carrier layer is utilized to lift-off and protect the thin film materials or devices.

FIGS. 3A through 3G illustrate a first lift-off and bonding process 60 wherein a carrier layer 74 is utilized to lift off, protect, transport, align, and ultimately bond thin film materials 66 or devices 68, including compound semiconductors. With reference to FIG. 3A, a growth substrate 62 is provided with a sacrificial layer 64 and a thin film material 66. The sacrificial layer 64 and material 66 are deposited on the growth substrate 62 using any conventional technique. The material 66 can be any material, including amorphous material, polycrystalline material, crystalline material (for example, an epitaxial material), or combinations of the foregoing materials. Furthermore, "depositing" in the context of this document refers to any process for growing or forming one material on another as in the case of an epitaxial material.

In the preferred embodiment, the growth substrate 62 is GaAs. The sacrificial layer 64 is a thin layer of aluminum gallium arsenide $Al_xGA_{1-x}As$, where $0.6 \leq x \leq 1.0$. Moreover, the material 66 comprises $In_xGa_{1-x}As_yP_{1-y}$ (n-type or p-type), where $0 < x < 1$ and $0 < y < 1$.

Figure 3B:
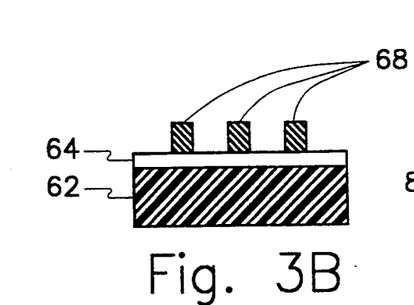

Although not required to practice the novel process 60, mesa etch processing may be employed to pattern the material 66 in order to form one or more devices 68. For simplicity, the discussion hereafter refers only to the devices 68 and not to the material 66, but it should be understood that the discussion is equally applicable to the material 66 in an unpatterned state. Moreover, FIG. 3B shows several devices 68 to emphasize that, in general, the process 60 is performed on a mass scale to produce large pluralities of the devices 68 at a time. The devices 68 can be, for example, a transistor, diode configuration, communication device, compound semiconductor device, or any other desired device. The mesa etch uses, for example, a photoresist mask and is performed using, for instance, $H_2SO_4:H_2O_2:H_2O(1:8:160)$ as a fast gross etch with a final selective etch of $NH_4OH:H_2O_2(1:200)$ which stops at the AlAs sacrificial layer 64.

Figure 3C:
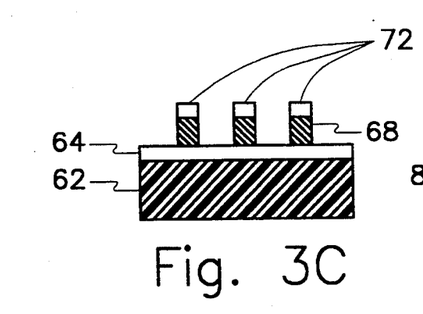

Other processing steps can occur relative to the devices 68 either before or after the mesa etch patterning. For instance, as shown in FIG. 3C, one or more material layers 72 can be deposited on the devices 68. The material layers 72 may comprise metals (for contacts, as an example), semiconductors, or dielectrics. Deposition of the material layers 72 can occur using any of numerous conventional techniques. In the preferred embodiment, material layers 72 are deposited on the devices 68 via vacuum deposition.

Figure 3D:
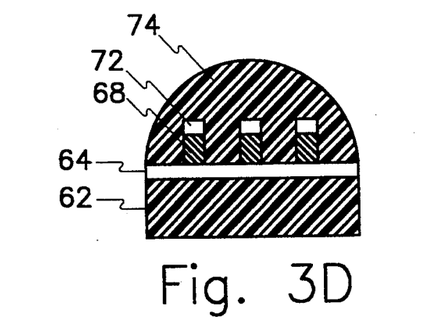

Next, the devices 68, with or without material layers 72, are completely coated with a carrier layer 74. In the preferred embodiment, the carrier layer 74 is either a transparent polyimide or other organic material which itself can be made to act as a release layer. Apiezon W, which is essentially a black, opaque wax, can also be utilized as described in U.S. Pat. No. 4,846,931 to Gmitter et al. of Bellcore. Furthermore, it is also possible that the carrier layer 74 could be a metal, which has been evaporated, sputtered, and/or plated over the devices 68. However, use of a transparent polyimide is preferred for several reasons. Because of its transparency, devices 68 can be viewed while encapsulated and therefore aligned as will be further discussed hereinafter. Moreover, polyimides exhibit the desirable mechanical property of being under residual tensile stress at room temperature. See Allen, M. G., Mehregany, M., Howe, R. T., and Senturia, S. D., "Microfabricated Structures for the In-Situ Measurement of Residual Stress, Young's Modulus, and Ultimate Strain of Thin Films," *Applied Physics Letters*, Volume 51, No. 4, pp. 241–244, 1987. Finally, the thermal properties of polyimides are excellent. Temperatures in excess of 400° C. can be maintained without damage to the polyimide or devices 68 protected thereby.

Figure 3E:
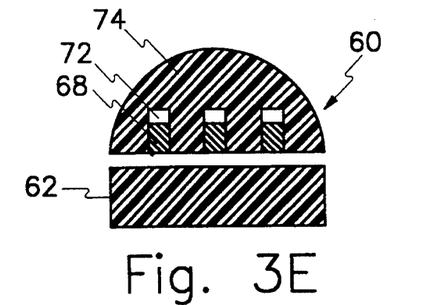

Next, as shown in FIG. 3E, the sacrificial layer 64 is etched away using a standard $HF:H_2O$ (1:10) etch solution to separate the devices 68 and surrounding carrier layer 74 from the growth substrate 62, as shown in FIG. 1E. In accordance with a significant aspect of the present invention, metal layers (e.g., Al) or $Al_xGa_{1-x}As$ layers where x>0.4 can be included in the devices 68, because the devices 68 are protected on their sides from the etch solution $HF:H_2O$ (1:10) by the carrier layer 74. For a further discussion, see I. Pollentier, L. Buydens, P. Van Daele, P. Demeester, "Fabrication of GaAs—AlGaAs GRIN—SCH SQW Laser Diode on Silicon by Epitaxial Lift-Off," *IEEE Phot. Tech. Lett.*, 3, 2, pp. 115–117, 1991.

After the combination of the devices 68 and the carrier layer 74 has been etched away from the substrate 62, the combination can easily be handled and transported.

Figure 3F:
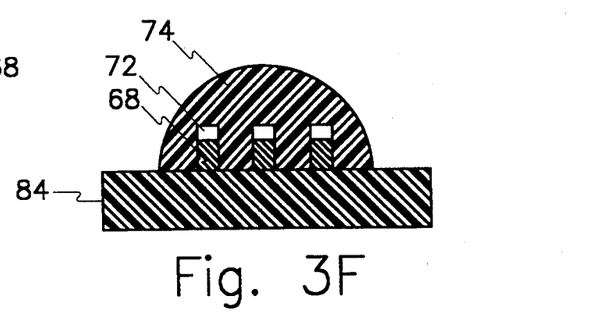

The devices 68 are next placed in contact with a host substrate 84, as shown in FIG. 3F. If the carrier layer 74 is a transparent polymer, alignment of the devices 68 with particular circuitry on the host substrate 84 is easily accomplished.

The devices 68 are bonded to the host substrate 84 by a variety of forces, including vander Waals bonding and metal-metal annealing. "Bonding" means affixing, adhering, or otherwise attaching one existing material or device to another.

After the devices 68 have been aligned and positioned over desired locations on top of the host substrate 84, the carrier layer 74 is dissociated from the devices 68. The dissociation can be effectuated using many techniques.

For example, the bond between devices 68 and the carrier layer 74 can be broken by the following well known methods: (1) thermally, for example, through spot heating or through local application of high-intensity laser light, (2) photolytically through local exposure to short-wavelength laser light, (3) photochemically through local exposure to short-wavelength laser light in the presence of a reactive gas, or (4) chemically by etching or dissolution. After dissociation, the devices 68 are in contact with the desired locations on the host substrate 84, as indicated in FIG. 3G.

Figure 3G:
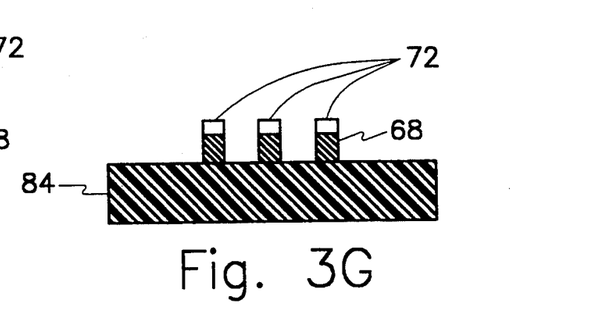

Preferably, the procedure in FIG. 3G is performed within a clean room. Moreover, the host substrate 84 can comprise a Si or GaAs circuit which has been developed and optimized, in perhaps a foundry, independent of the devices 68.

An oven-annealing step may be desirable at this point to further consolidate and strengthen the bonds between the devices 68 and the host substrate 84. Furthermore, a whole-wafer cleaning might also be carried out to remove any residual material from the carrier layer 74.

Another aspect of the first lift-off and bonding process 60 is that a peripheral frame (not shown) can be bonded to the carrier layer 74 before the growth substrate 62 is freed. The peripheral frame can help in handling and aligning the devices 68. The assembly would resemble a mounted pellicle after release from the growth substrate 62.

III. Second Lift-Off And Bonding Process

FIGS. 4A through 4H illustrate a second lift-off and bonding process 80 utilizing a transfer medium for transporting and inverting the devices 68. As with the first lift-off and bonding process 60, the second lift-off and bonding process 80 may be used to fabricate the electromagnetic communication devices 27, 33, 50 of FIGS. 2A–2C.

The process steps described relative to FIG. 3A–3E of the first lift-off and bonding process 60 are substantially identical to the respective process steps of FIGS. 4A–4E of the second lift-off and bonding process 80. Consequently, the discussion relative to FIGS. 3A–3E is incorporated herein by reference and is applicable to the second lift-off and bonding process 80.

Figure 4A:
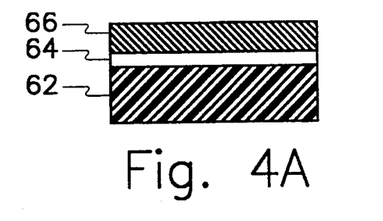
FIGS. 4A-4H show a second lift-off and bonding process for thin film materials or devices, such as the devices of FIGS. 2A-2C, wherein a transfer medium is utilized to transfer and invert the thin film materials or devices.
Figure 4B:
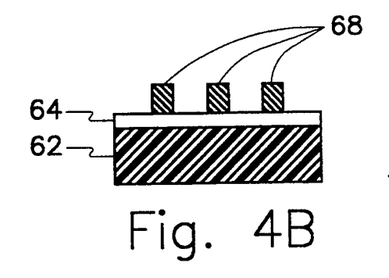
Figure 4C:
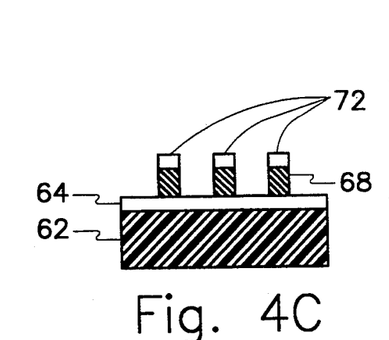
Figure 4D:
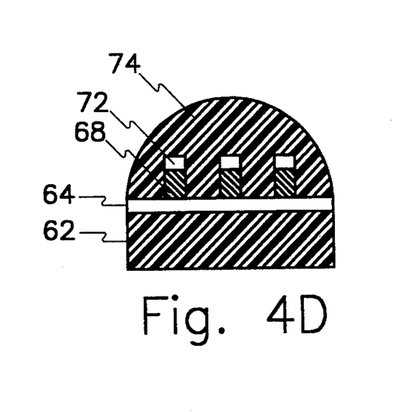
Figure 4E:
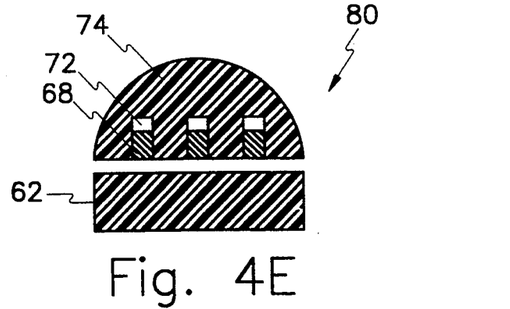
Figure 4F:
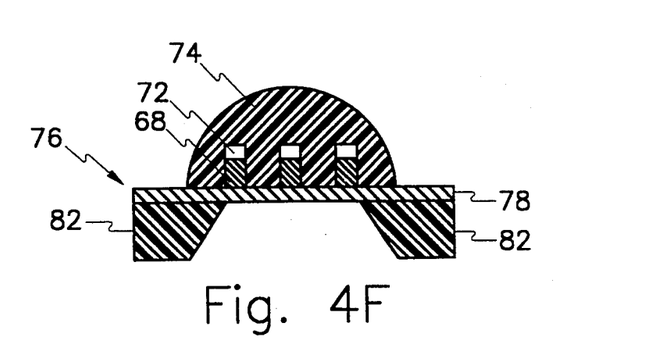

At the step shown in FIG. 4F, the second lift-off and bonding process 80 calls for placing the freely maneuverable combination of the devices 68 and the carrier layer 74 onto a transfer medium 76, which in the preferred embodiment, is a diaphragm assembly comprising a diaphragm 78 and support ring 82. The diaphragm assembly 76 is a drum-like structure fabricated using any standard micromachining techniques.

Preferably, the diaphragm assembly 76 is formed by first coating a Si wafer with approximately 4 microns of a transparent polyimide. The transparent polyimide is spin cast from a commercially available polymeric acid solution (DuPont PI 2611) which is baked at 150° C. in air for 30 minutes and cured at 400° C. in nitrogen for 1 hour. After the Si wafer has been coated with the polyimide, the central portion of the Si wafer is etched from the backside using a $HF:HNO_3:H_2O$ etchant using a single-sided etching technique. A single-sided etching technique for this purpose is disclosed in J. Y. Pan and S. D. Senturia, "Suspended Membrane Methods for Determining the Effects of Humidity on the Mechanical Properties of Thin Polymer Films," *Society of Plastics Engineers Technical Papers: ANTEC '91*, Volume 37, pp. 1618–1621, May, 1991. The etching process results in the diaphragm assembly 76 having a polymeric diaphragm 78, which measures approximately 4 $\mu$m thick and 3-25 millimeters (mm) in diameter, and which is supported by a Si ring 82. The polymeric diaphragm 78 is transparent, taut, and mechanically tough. Thus, the polymeric diaphragm 78 is ideal as a carrier for the devices 68.

Optionally, a low power oxygen plasma etch is performed on the diaphragm 78 prior to bonding of the devices 68. The oxygen plasma etch enhances the adhesion of the devices 68 to the diaphragm 78.

Next, the carrier layer 74 is dissolved while affixed to the diaphragm assembly 76. In the preferred embodiment, trichloroethylene is used to dissolve the Apiezon W. As a result, the devices 68 are left alone bonded to the top of the polymeric diaphragm 78. Note that the prelift-off processing materials, for example, the material layers 72, now reside on the top of the devices 68 supported by the polymeric diaphragm 78.

Figure 4G:
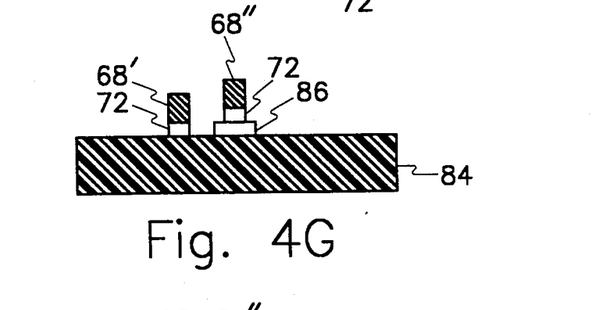

As shown in FIG. 4G, the devices 68 can now be selectively aligned through the transparent polymeric diaphragm 78 and bonded to a host substrate 84. Note that one or more devices 68', 68" can be selectively bonded from an array of devices 68 as illustrated in FIG. 4G, or alternatively, the entire array of devices 68 can be bonded concurrently to the host substrate 84. Preferably, the process shown in FIG. 4G is performed within a clean room. Moreover, the host substrate 84 can comprise a circuit containing a Si or a GaAs substrate which has been developed, perhaps in a foundry, independent of the devices 68.

The bonding of the devices 68 to the host substrate 84 can be effectuated via many techniques. All techniques for causing release of the devices 68, which were described above in regard to the first lift-off and bonding process 60 of FIGS. 3A–3G, can be utilized in the second lift-off and bonding process 80 of FIGS. 4A–4H. In addition, the polymeric diaphragm 78 can be etched away around the devices 68 so as to release the devices 68 onto the host substrate 84. Furthermore, it is envisioned that the polymeric diaphragm 78 could be fabricated in a web-like manner so as to facilitate tearing and release of the devices 68. To further enhance the alignment of devices 68, the diaphragm assembly 76 may be placed in a mask aligner. With the diaphragm assembly 76 in a mask aligner, the devices 68 can be positioned on the host substrate 84 with a high precision (at least to within 1 $\mu$m).

Another feature of the second lift-off and bonding process 80 is that the devices 68 with material layers 72 can be bonded directly to metal contact layers 86 situated at the top surface of the host substrate 84, as illustrated by device 68" in FIG. 4G. If the material layer 72 of device 68" is metal, then the coupling of the material layers 72 and the metal contact layer 86 associated with the device 68" forms a much better electrical bond therebetween, than merely a vander Waals bond, generally because of the surface characteristics of metals. Additionally, if the material layer 72 is metal, it can be fused with the metal contact layer 86 via a heating process so as to further enhance the electrical characteristics of the connection.

Figure 4H:
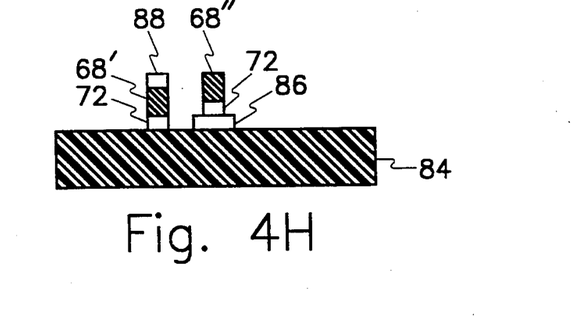

Further, as shown in FIG. 4H, one or more other material layers 88, such as a metal, semiconductor, or dielectric layer, or combinations thereof, may be deposited upon the devices 68 after the devices 68 are bonded to the host substrate 84 or to the layer 86 on the host substrate 84. Thus, the foregoing second lift-off and bonding process 80 allows material layers, such as metal, semiconductor, or dielectric layers, to be deposited on both sides of each of the devices 68, as illustrated by the device 68' in FIG. 4H. Note that the resonant cavity device 50 of FIG. 2C, which has mirror layers 54 on both planar sides of a thin film active region 56, may be constructed using the foregoing methodology. It should be further noted that the devices 68 are supported by a substrate (either the growth substrate 62 or host substrate 84) during the deposition process on each side, thereby providing mechanical support to the devices 68 while the potentially stress and/or strain producing layers 88, 72 are deposited onto the devices 68.

IV. Optical Detector Array For Imaging Systems

For image processing and other video applications, an array 90 of optical detectors 98, illustrated in FIG. 5, can be bonded to any suitable substrate in accordance with the novel processes 60, 80, 100 of the present invention. Such an array 90 would have many advantages.

The optical detectors 98 can be configured to simultaneously receive optical signals 91 from an image. The optical signals 91 are then processed massively in parallel so as to gain a substantial speed advantage in processing, and consequently, real time evaluation of the image.

FIG. 6 shows a partial cross-section of the array 90 taken along line 6'—6'. Preferably, the array 90 is fabricated by first applying an insulating layer 92, such as a polyimide layer, on the host substrate 84, which has optical signal processing circuitry 84'. The host substrate 84 can be Si, GaAs, or any other suitable substrate material. Moreover, the polyimide layer 92 can be about 1–4 microns in thickness. Next, holes 94 are cut into the polyimide layer 92. The holes 94 are filled or partially filled with metal or metal alloy, preferably gold (Au) to form interconnects 96. Finally, the thin film optical detectors 98 comprising, for instance, $In_xGa_{1-x}As_yP_{1-y}$ (n-type or p-type) where $0 < x < 1$ and $0 < y < 1$, a diode configuration, or some other suitable semiconductor, are bonded to the metal interconnects 96 using one of the lift-off and bonding processes 60, 80 disclosed herein.

If the optical detectors 98 comprise $In_xGa_{1-x}As_yP_{1-y}$, then the metal interconnects 96 serve the purpose of creating a MSM diode junction, as shown and described relative to FIG. 2A, and serve the purpose of communicating signals to the underlying processing circuitry 84' within the host substrate 84. If the optical detectors 98 are junction or diode devices, as shown and described relative to FIG. 2B, then the metal interconnects 96 serve to connect the detectors 98 to the underlying processing circuitry 84'. Because the metal interconnects 96 are extremely short, for example, about 1–2 microns, virtually no parasitic capacitance will hinder the speed of the optical detectors 98.

Each of the optical detectors 98 can be allocated its own processing circuitry 84', as further shown in FIG. 6. Essentially, the processing circuitry 84' can directly and immediately process the optical signals 91.

A neural network can be situated in the host substrate 84. In other similar embodiments, the data could be partially processed by the host substrate 84, and then the optical signal data could be sent to a remote neural network or another substrate.

The processing circuitry could also be configured in hierarchical layers. In other words, another layer of processing circuitry (not shown) could integrate the results of the various elements of processing circuitry 84'.

V. Third Lift-Off And Bonding Process

The array 90 of optical detectors 98 described in relation to FIGS. 5 and 6 can be produced by using the novel processes 60, 80 of respective FIGS. 3 and 4. However, in addition, the inventors have developed a third lift-off and bonding process 100 directed to producing an array 90 of detectors 98 having $In_xGa_{1-x}As_yP_{1-y}$.

Figure 7A:
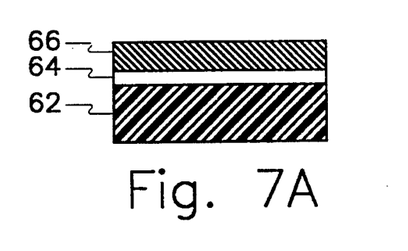
FIGS. 7A-7G Show a third lift-off and bonding process for producing the optical detectors of FIGS. 5 and 6.
Figure 7B:
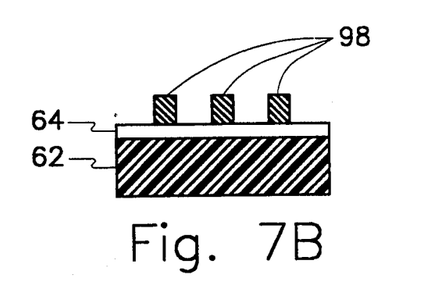
Figure 7C:
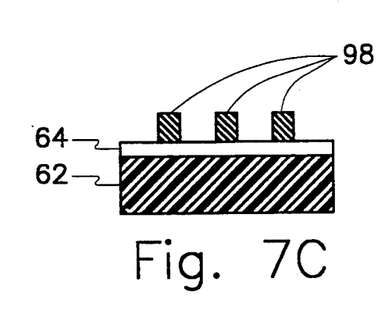

The third lift-off and bonding process 100 will be described with regard to FIG. 7. The steps of the process which are shown in FIGS. 7A, 7B, 7C are substantially similar to the steps shown and described relative to, respectively, FIGS. 3A, 3B, 3D and 4A, 4B, 4D. Therefore, the discussion in regard to the latter figures is incorporated herein and applies to the third lift-off and bonding process 100 of FIG. 7. Briefly described, referring to FIG. 7A, a growth substrate 62 is provided with a sacrificial layer 64 and a thin film material 66. In the process of FIG. 7, the growth substrate 62 is InP, the sacrificial layer 64 is $In_xGa_{1-x}As_yP_{1-y}$ material, where $0<x<1$ and $0<y<1$, which is grown on the growth substrate 62, and the material 66 is a $In_xGa_{1-x}As_yP_{1-y}$ material, where $0<x<1$ and $0<y<1$, which is grown on the sacrificial layer 64. Mesa etch processing is then used to define, or pattern, the detectors 98 from the material 66, as illustrated in FIG. 7B. The detectors 98 are then completely coated with the carrier layer 74 in order to encapsulate the devices 98 on the growth substrate 62, as shown in FIG. 7C.

Figure 7D:
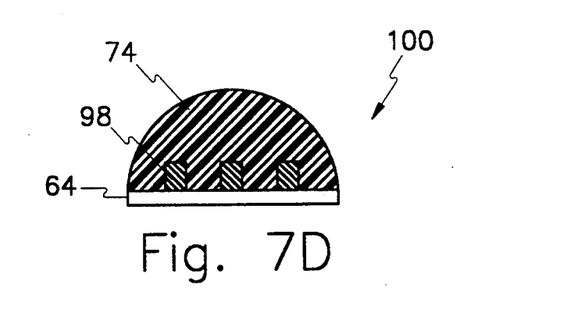
Figure 7E:
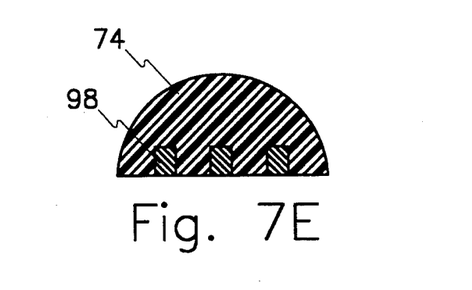
Figure 7F:
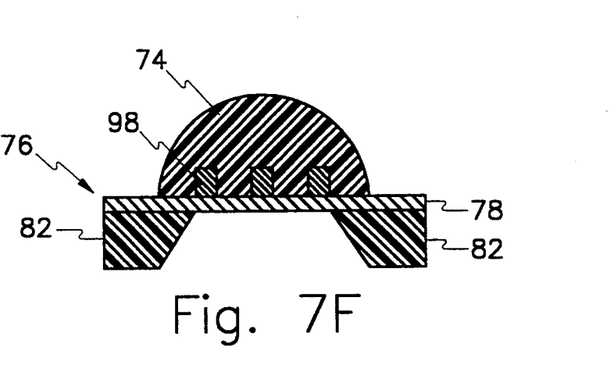
Figure 7G:
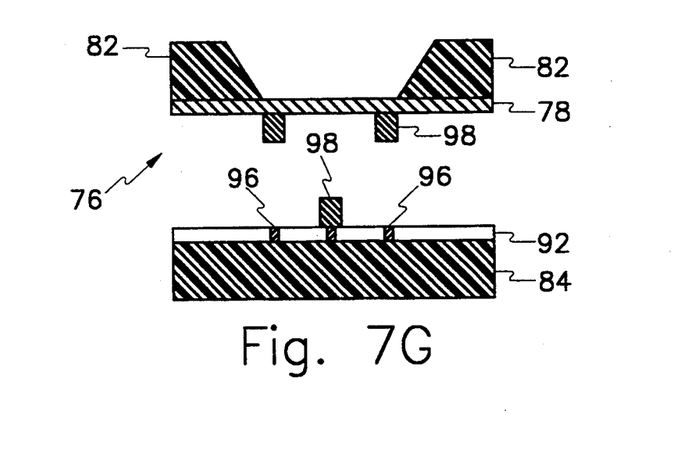

After the carrier layer 74 has been applied, the InP growth substrate 62 is etched away with a first etch solution. In the preferred embodiment, the first etch solution can be, for example, $HCl:H_3PO_4$ (3:1). The first etch solution does not affect the InGaAsP sacrificial layer 64, as shown in FIG. 7D. The InGaAsP sacrificial layer 64 can be left with and used as part of the detectors 98 for the purpose of aiding emission, detection, or modulation. Alternatively, a second etch solution, which can be, for example, $HF:H_2O_2:H_2O$ (1:1:10) or $H_2SO_4:H_2O_2:H_2O$ (1:1:1) in the preferred embodiment, can be applied to remove the InGaAsP sacrificial layer 64, as illustrated in FIG. 7E. Metals, semiconductors, and/or dielectric layers can be deposited onto both sides of the detectors 98 as outlined above in the discussion of the second lift-off and bonding process 80.

At this point, the detectors 98 can be selectively aligned and selectively bonded to any location on the host substrate 84. In the alternative, as shown in the successive steps of FIGS. 7F and 7G, the transfer medium 76 can be used to invert the detectors 98 before bonding them to the host substrate 84.

VI. Micromechanical Devices

The present invention provides for the monolithic integration of any thin film materials and any devices on micromechanical devices. A micromechanical device is a device which is fabricated using integrated circuit technology or related arts and which performs transduction of electrical energy to mechanical energy, or vice versa. Generally, micromechanical devices must comprise a movable element(s). Significantly, in accordance with the present invention, thin film materials or devices are formed and optimized on a growth substrate and are then bonded to the movable element(s) of a micromechanical device.

As illustrated in a top view of FIG. 8, a micromechanical device 110 of the preferred embodiment has a thin film photonic device 112 on a generally square movable platform 114, which is supported by elongated legs 144a–144d above a substrate 134. A movable micromechanical platform with support legs, similar to the platform 114 of the present invention, has been produced previously in the art. See Y. W. Kim and M. G. Allen (a co-inventor herein), "Single and Multilayer Surface Micromechanical Platforms Using Sacrificial Layers," Sensors and Actuators, Vol. 35, No. 1, October 1992, pp. 61–68. Through the appropriate application of external voltages of typically around 35 V, the prior art platform can be actuated in both the vertical and lateral directions by as much as approximately 5 $\mu$m and 15 $\mu$m, respectively.

The micromechanical device 110 of the present invention is fabricated by producing the photonic device 112 independently of the platform 114 and associated structure. The photonic device 112 is fabricated and then bonded to the platform 114 in accordance with the methodology of the second lift-off and bonding process 80 of FIGS. 4A–4H, which process utilizes the novel transfer medium 76. Accordingly, the discussion details relative to the second lift-off and bonding process 80 of FIGS. 4A–4H is incorporated herein by reference, and therefore only a brief overview of the procedure for fabricating and bonding the photonic device 112 is set forth hereafter for simplicity.

Figure 9:
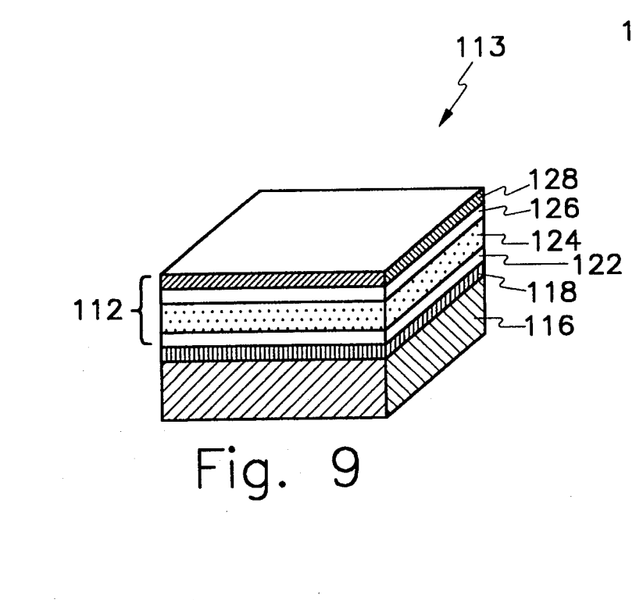
FIG. 9 shows a photonic device used in the micromechanical device of FIG. 8.

The photonic device 112 comprises a AlGaAs/GaAs/AlGaAs double heterostructure, which can be employed as an emitter, detector, or modulator by applying certain voltage biases. The as-grown layer structure 113 of the photonic device 112 is illustrated in FIG. 9. As shown in FIG. 9, an undoped AlAs sacrificial layer 118 with 0.2 $\mu$m thickness is grown lattice matched to a GaAs growth substrate 116. The photonic device 112 is then grown lattice matched on top of the AlAs sacrificial layer 118. The double heterostructure device layers of the photonic device 112 are then deposited over the sacrificial layer 118 and comprise the following successive layers and parameters: a device layer 122 of $Al_{0.3}Ga_{0.7}As$ ($n=3\times10^{17}cm^{-3}$, 0.5 $\mu$m thick), a device layer 124 of GaAs ($n<10^{14}cm^{-3}$, 1.1 $\mu$m), and a device layer 126 of $Al_{0.3}Ga_{0.7}As$ ($p=1.3\times10^{19}cm^{-3}$, 0.5 $\mu$m thick). The successive device layers 124, 126, 128 are mesa etched with a combination of nonselective and selective GaAs/AlGaAs etchants.

Additionally, a AuZn/Au metallic electrode 128 is bonded and patterned on the device layer 126 using standard photolithographic techniques and metal etches. Although the metallic electrode 128 is initially on top of the as-grown structure 113, the device 112 with metallic electrode 128 is inverted when bonded by the transfer medium 76 (FIG. 4F and 4G) so that the metallic electrode 126 eventually resides on the bottom of the device 112 in the final integration. Therefore, the metallic electrode 128 is referred to as the bottom electrode of the photonic device 112.

The photonic device 112 is coated with a carrier layer of Apiezon W black wax, and the entire as-grown structure 113 is immersed in 10% HF to selectively etch away the AlAs sacrificial layer 118. After separation from the growth substrate 116, the photonic device 112 is bonded to the transfer medium 76. The transfer medium 76 preferably comprises the transparent polyimide diaphragm 78 so that the device 112 can be accurately and selectively aligned during bonding of the device 112 on the host substrate. After positioning and aligning the device 112, the photonic device 112 is bonded to the moveable platform 114 of the photonic device 112.

Figure 10A:
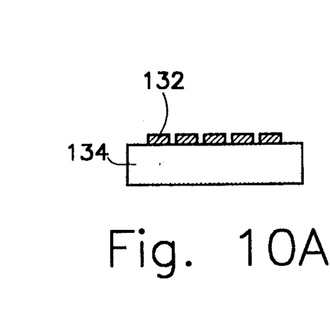
Figure 10B:
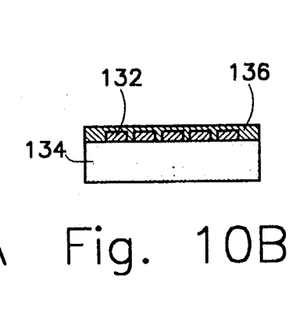
Figure 10C:
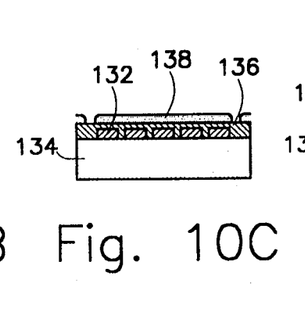
Figure 10D:
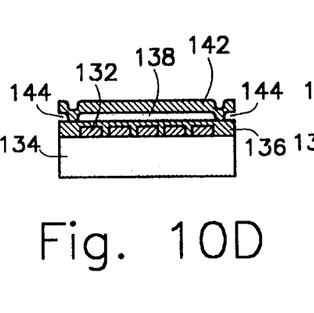

The platform 114 is fabricated using standard micromachining techniques, as will be described relative to FIGS. 10A–10I. Referring to FIG. 10A, a plurality or array of Au strip-like substrate electrodes 132 are defined on an electrically isolated Si wafer 134. These substrate electrodes 132 are insulated with a polyimide layer 136 which is bonded over the substrate electrodes 132, as shown in FIG. 10B. As illustrated in FIG. 10C, a copper (Cu) release layer 138, measuring preferably 2.5–3.0 $\mu$m, is bonded on top of the polyimide layer 136. Further, as indicated in FIG. 10D, at least one and preferably three layers 142 of polyimide are spun onto the Cu release layer 38. The polyimide layer(s) 142 essentially produces the supporting infrastructure of the top platform 114 and the support legs 144a–144d. In the preferred embodiment, the platform size is 360 $\mu$m $\times$ 360 $\mu$m or 200 $\mu$m $\times$ 200 $\mu$m having respective leg widths of 20 $\mu$m and 40 $\mu$m for receiving a photonic device 112 having a respective size of 250 $\mu$m $\times$ 250 $\mu$m or 100 $\mu$m $\times$ 100 $\mu$m.

Figure 10E:
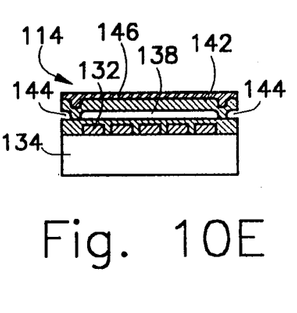

Next, as illustrated in FIG. 10E, the polyimide layer(s) 142 is coated with a gold (Au) layer 146. The Au layer 146 is bonded across the entire top surface of the layer(s) 142 and on the top surfaces of the opposing legs 144a, 144c, as shown in FIG. 8. The Au layer 146 facilitates bonding of the photonic device 112 to the platform 114 by easily bonding or fusing with the AuZn/Au metallic bottom electrode 128 of the photonic device 112. In a sense, the Au layer 146 in combination with the AuZn/Au layer 128 form the ultimate bottom electrode of the micromechanical device 110. Moreover, the bottom electrode is electrically accessible at the surface of the substrate 134 as a result of the interconnecting paths running along legs 144a, 144c.

Figure 10F:
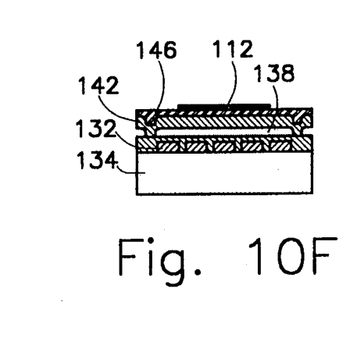
Figure 10G:
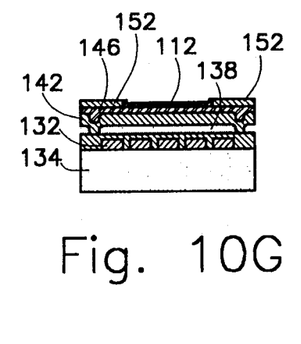

After deposition of the Au layer 146, the photonic device 112 is bonded to the platform 142 using the transfer medium 76, as illustrated in FIG. 10F. The procedure is described in detail relative to FIGS. 4F and 4G. Next, as shown in FIG. 10G, a polyimide insulating layer 148 is spun over the exposed regions of the platform 114 and the photonic device 112, and a top access window 152 to the photonic device 112 is opened using any suitable technique, for instance, a reactive ion etching (RIE) technique.

Figure 10H:
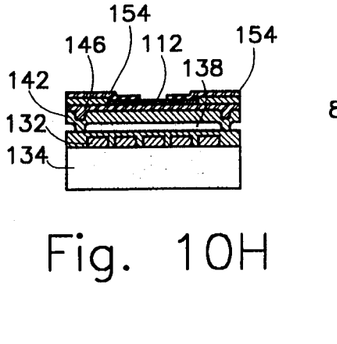

A top electrode 154 of the micromechanical device 110 is now defined in the step shown in FIG. 10H. The top electrode 154 is defined so that the electrode 154 covers the top surface perimeter around the photonic device 112 and runs along the top surfaces of the two opposing legs 144b, 144d of the platform 114, as illustrated in the top view of FIG. 8.

Figure 10I:
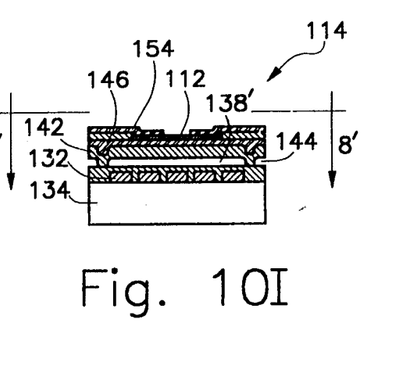
FIG. 10I shows a cross section of the micromechanical device of FIG. 8 taken along line 10I'—10I'.

As illustrated in FIG. 10I, the copper release layer 138 is removed from the substrate 134 by etching away the copper release layer 138 with a FeCl$_3$ solution, resulting in the micromechanical device 110 having a platform 114 with an integrated thin film photonic device 112.

At this point, the photonic device 112 may be electrically operated by applying voltages to the three available electrical electrode sources: the substrate electrodes 132, the bottom electrode 128, and the top electrode 154. The bottom and top electrodes 128, 154 can be probed via respective pads 156a, 156c and 156b, 156d at the ends of the respective platform legs 144a, 144c and 144b, 144d. When voltage is applied between the top and bottom electrodes 154, 128, the device 112 emits or detects light. Furthermore, when an electrical source, such as a voltage or current source, is applied between the bottom electrode 128 and the substrate electrodes 132, the platform 114 is moved vertically and/or laterally. The platform 114 can be moved in a plurality of vertical and/or lateral directions as a result of the spaced array of substrate electrodes 132, which may be selectively energized.

The micromechanical device 110 of the present invention has many advantages over the prior art. Previous work aimed at producing micromechanical devices with photonic elements has been focused almost exclusively on the micromachining of gallium arsenide or other compound semiconductor materials which can emit light. However, these prior art embodiments lack the excellent mechanical properties of silicon and do not have established micromachining or circuit fabrication facilities as compared with silicon. In the present invention, a micro-opto-mechanical system is formed which combines the ability to conduct and steer light with all of the advantages of silicon.

There are many applications for the micromechanical device 110. For example, in the optoelectronic industry, labor-intensive manual alignment of fibers with light emitters or detectors is expensive and time-consuming. Thus, the end cost of fiber optic "pigtailed" products is significantly higher than the sum cost of its components. In the few automatic alignment systems which are currently emerging, the fibers themselves are moved into position while the optoelectronic device is held stationary. These techniques typically must employ high-voltage piezoelectric or electrostatic effects because of the relatively large mass of the fiber and the distances moved. The micromechanical device 110 in accordance with the present invention provides a much more economical and efficient coupling solution. The micromechanical device 110 can be used to automatically align an emitter/detector with an optical fiber by holding the optical fiber stationary while moving the photonic device 112 via electrical control signals applied to the substrate electrodes 132 and the bottom electrode 146.

Other applications for the micromechanical device 110 include interferometric devices, such as accelerometers, and communications applications where receiver selective reception of light signals of various wavelengths is required. With respect to interferometric devices using the micromechanical device 110, the micromechanical device 110 is moved, and during movement, inertia causes the platform 114 and the photonic device 112 to move, thereby changing the shape of the cavity 138' beneath the platform 114. This change in cavity shape can be used to either control the wavelength of light to which a detector is sensitive or to control the frequency of operation of an emitter. Alternatively, the transmissive characteristics of the optical system made of device 112, cavity 138', and substrate 134 are altered due to the change in size of cavity 138'.

In communications applications, the micromechanical device 110 can be operated like a filter. The photonic device 112 is positioned a particular distance above the substrate 134 so that only a certain wavelength or bandwidth of light is received for processing. Those persons skilled in the art will readily appreciate the many modifications that are possible without materially departing from the novel teachings of the present invention. Accordingly, all such modifications are intended to be included within the scope of the present invention, as set forth in the following claims.

Wherefore, the inventors claim the following:

1. A micromechanical device for providing efficient steerable optical coupling with integrated circuitry, comprising:
    a movable platform supported by legs on a substrate, said substrate having a substrate electrode, said platform having a bottom electrode, and wherein said platform is moved by applying a first electrical source between said substrate electrode and said bottom electrode; and
    a photonic device residing on said platform and movable therewith, said photonic device being created on a growth substrate remote from said movable platform and subsequently bonded to said movable platform, said photonic device having a top electrode thereon, said photonic device serving as a light interface when a second electrical source is applied between said top electrode and said bottom electrode.

2. A resonant cavity device, comprising:
    an active region having a first side and a second side;
    a first mirror layer situated adjacent to said first side, said first mirror layer being deposited after said active region is deposited on a first substrate; and
    a second mirror layer situated adjacent to said second side, said second mirror layer being deposited after the combination of said active region and said first mirror layer are bonded to a second substrate.

3. The micromechanical device of claim 1, wherein said photonic device is created on a growth substrate remote from said movable platform and is subsequently placed onto said movable platform.

4. The micromechanical device of claim 1, wherein said photonic device is created and disposed on said platform by the following steps:
    depositing said photonic device onto a sacrificial layer situated on a growth substrate;
    coating said photonic device with a carrier layer;
    removing said sacrificial layer to release the combination of said photonic device and said carrier layer from said growth substrate;
    positioning said photonic device on a transfer medium;
    removing said carrier layer; and
    bonding said photonic device to said platform from said transfer medium.

5. The micromechanical device of claim 1, wherein said photonic device comprises thin film semiconductor layers.

6. The micromechanical device of claim 1, wherein said photonic device comprises $In_xGa_{1-x}As_yP_{1-y}$ where $0<x<1$ and $0<y<1$.

7. The micromechanical device of claim 1, wherein said substrate comprises silicon and wherein said photonic device comprises $In_xGa_{1-x}As_yP_{1-y}$ where $0<x<1$ and $0<y<1$.

8. The micromechanical device of claim 1, wherein said legs of said movable platform comprise polyimide.

9. The micromechanical device of claim 1, wherein said movable platform comprises a rectangular platform surface supported by legs at corners of the rectangular surface.

10. The micromechanical device of claim 1, wherein said photonic device is a resonant cavity device.

11. The micromechanical device of claim 9, further comprising a plurality of bottom electrodes situated on said substrate and capable of receiving charge from said first electrical source, whereby said bottom electrodes are selectively activated by said first electrical source so that said platform is selectively moved as the electric field between said bottom electrodes and said substrate electrode is changed.

12. A micromechanical device for interfacing light with an electronic circuit, comprising:
    a platform supported by legs on a substrate;
    means for moving said platform; and
    a photonic device residing on said platform and movable with said platform, said photonic device connected to a circuit and serving as a light interface to said circuit, said photonic device being created on a growth substrate remote from said movable platform and subsequently bonded to said movable platform.

13. The resonant cavity device of claim 2, wherein said active region comprises a diode configuration.

14. The resonant cavity device of claim 2, wherein said first mirror layer comprises $In_xGa_{1-x}As_yP_{1-y}$ where $0<x<1$ and $0<y<1$.

15. The resonant cavity device of claim 2, wherein said second mirror layer comprises $In_xGa_{1-x}As_yP_{1-y}$ where $0<x<1$ and $0<y<1$.

16. The resonant cavity device of claim 2, further comprising first and second metal layers disposed on said first and second mirror layers respectively and situated at opposing outer ends of said resonant cavity device.

17. The resonant cavity device of claim 2, wherein said active region emits a signal.

18. The resonant cavity device of claim 2, wherein said active region detects a signal.

19. The resonant cavity device of claim 2, wherein said active region modulates a signal.

20. A resonant cavity configuration, comprising:
    a host substrate; and
    a resonant cavity device bonded to said host substrate, said resonant cavity device comprising an active region having a first side and a second side, a first mirror layer situated adjacent to said first side, and a second mirror layer situated adjacent to said second side, said active region and said first mirror layer being formed on a remote growth substrate and subsequently bonded to said host substrate, said second mirror layer being formed on said active region after the combination of said active region and said first mirror layer are deposited on said host substrate.

21. The micromechanical device of claim 1, wherein said moveable platform comprises a generally square platform surface supported by legs at corners of said platform surface.

22. The micromechanical device of claim 1, wherein said substrate electrode comprises gold.

23. The micromechanical device of claim 1, wherein said bottom electrode comprises AuZn/Au.

24. The micromechanical device of claim 1, wherein said photonic device emits a signal.

25. The micromechanical device of claim 1, wherein said photonic device detects a signal.

26. The micromechanical device of claim 1, wherein said photonic device modulates a signal.

27. The micromechanical device of claim 4, wherein said sacrificial layer is AlAs.

28. The micromechanical device of claim 4, wherein said growth substrate is GaAs.

29. The micromechanical device of claim 4, wherein said carrier layer is Apiezon W black wax.

30. The micromechanical device of claim 4, wherein said sacrificial layer is removed by immersion in 10% HF.

31. The micromechanical device of claim 5, wherein said thin film semiconductor layers comprise a crystalline material.

32. The micromechanical device of claim 21, wherein said platform surface measures 360 micrometers by 360 micrometers and said legs have a width of 20 micrometers.

33. The micromechanical device of claim 21, wherein said square platform surface measures 200 micrometers by 200 micrometers and wherein said legs have a width of 40 micrometers.

34. The micromechanical device of claim 32, wherein said photonic device measures 250 micrometers by 250 micrometers.

35. The micromechanical device of claim 33, wherein said photonic device measures 100 micrometers by 100 micrometers.

* * * * *